(12) United States Patent
Toh et al.

(10) Patent No.: US 10,986,756 B2
(45) Date of Patent: Apr. 20, 2021

(54) COOLING APPARATUS FOR AN ELECTRICAL COMPONENT

(71) Applicant: Hughes Network Systems LLC, Germantown, MD (US)

(72) Inventors: Alex Toh, San Diego, CA (US); John Corrigan, Chevy Chase, MD (US); Doug Crouse, Germantown, MD (US); Kumud Patel, Clarksburg, MD (US)

(73) Assignee: HUGHES NETWORK SYSTEMS LLC, Germantown, MD (US)

( * ) Notice: Subject to any disclaimer, the term of this patent is extended or adjusted under 35 U.S.C. 154(b) by 0 days.

(21) Appl. No.: 15/856,480

(22) Filed: Dec. 28, 2017

(65) Prior Publication Data
US 2019/0208669 A1 Jul. 4, 2019

(51) Int. Cl.
*H05K 7/20* (2006.01)
*F28F 3/02* (2006.01)
*H04B 1/38* (2015.01)
*F28D 21/00* (2006.01)

(52) U.S. Cl.
CPC ......... *H05K 7/20418* (2013.01); *F28F 3/025* (2013.01); *H04B 1/38* (2013.01); *F28D 2021/0029* (2013.01); *F28F 2215/00* (2013.01); *F28F 2215/08* (2013.01)

(58) Field of Classification Search
CPC .............. H01L 23/467; H01L 23/3672; H01L 21/4882; H01L 23/473; F28D 2021/0029; F28F 3/02; F28F 3/025; H05K 7/20927
See application file for complete search history.

(56) References Cited

U.S. PATENT DOCUMENTS

| | | | | |
|---|---|---|---|---|
| 4,478,277 A * | 10/1984 | Friedman | ................ | F28F 3/025 165/170 |
| 5,022,462 A * | 6/1991 | Flint | ................... | H01L 23/4338 165/185 |
| 5,201,866 A * | 4/1993 | Mok | ........................ | F28F 3/02 165/185 |
| 5,771,966 A * | 6/1998 | Jacoby | ................ | H01L 21/4882 165/185 |
| 5,995,711 A * | 11/1999 | Fukuoka | ............ | B60H 1/00328 219/202 |
| 6,000,462 A * | 12/1999 | Gonner | ............... | H01L 21/4882 165/185 |
| 6,269,863 B1 * | 8/2001 | Wyler | ....................... | G06F 1/20 165/185 |
| 6,575,229 B1 * | 6/2003 | Taban | ................. | H01L 23/3672 165/185 |

(Continued)

*Primary Examiner* — Adam B Dravininkas
(74) *Attorney, Agent, or Firm* — Global IP Counselors, LLP (57) ABSTRACT

A cooling apparatus for an electrical component housing includes a fin configured to attach to the electrical component housing so as to conduct heat and cool the electrical component housing. The fin includes a first longitudinal portion and a second longitudinal portion, a first end, and a second end portion connecting the first and second longitudinal portions at a second end, the first longitudinal portion and the second longitudinal portion being disposed at a predetermined siatnce from each other at the first end, and the second end portion having a width that is greater than the predetermined distance.

19 Claims, 9 Drawing Sheets

(56) References Cited

U.S. PATENT DOCUMENTS

| | | | | |
|---|---|---|---|---|
| 2001/0050161 | A1* | 12/2001 | Chrysler | F28F 3/025 165/80.3 |
| 2002/0084060 | A1* | 7/2002 | Sasaki | H01L 23/3672 165/80.3 |
| 2010/0154788 | A1* | 6/2010 | Wells | H01L 31/052 126/658 |
| 2010/0157540 | A1* | 6/2010 | Yu | F28F 3/02 361/710 |
| 2011/0031612 | A1* | 2/2011 | Mitsui | H01L 23/3107 257/713 |
| 2012/0138283 | A1* | 6/2012 | Linderman | H01L 31/052 165/185 |
| 2013/0306273 | A1* | 11/2013 | Iyengar | H01L 23/473 165/104.19 |
| 2013/0306292 | A1* | 11/2013 | Iyengar | H01L 23/3672 165/185 |
| 2015/0136363 | A1* | 5/2015 | Huang | F28D 15/04 165/104.26 |
| 2015/0198372 | A1* | 7/2015 | Desikan | F28D 1/0366 165/151 |
| 2016/0338228 | A1* | 11/2016 | Suzuki | H01L 23/4334 |
| 2017/0117451 | A1* | 4/2017 | Matsumoto | H01L 33/642 |

* cited by examiner

COOLING APPARATUS FOR AN ELECTRICAL COMPONENT

BACKGROUND

Field of the Invention

The invention relates to a cooling apparatus for an electrical component. In particular, the present invention relates to cooling fins attached to an electrical component.

BACKGROUND OF THE INVENTION

Figure 1:
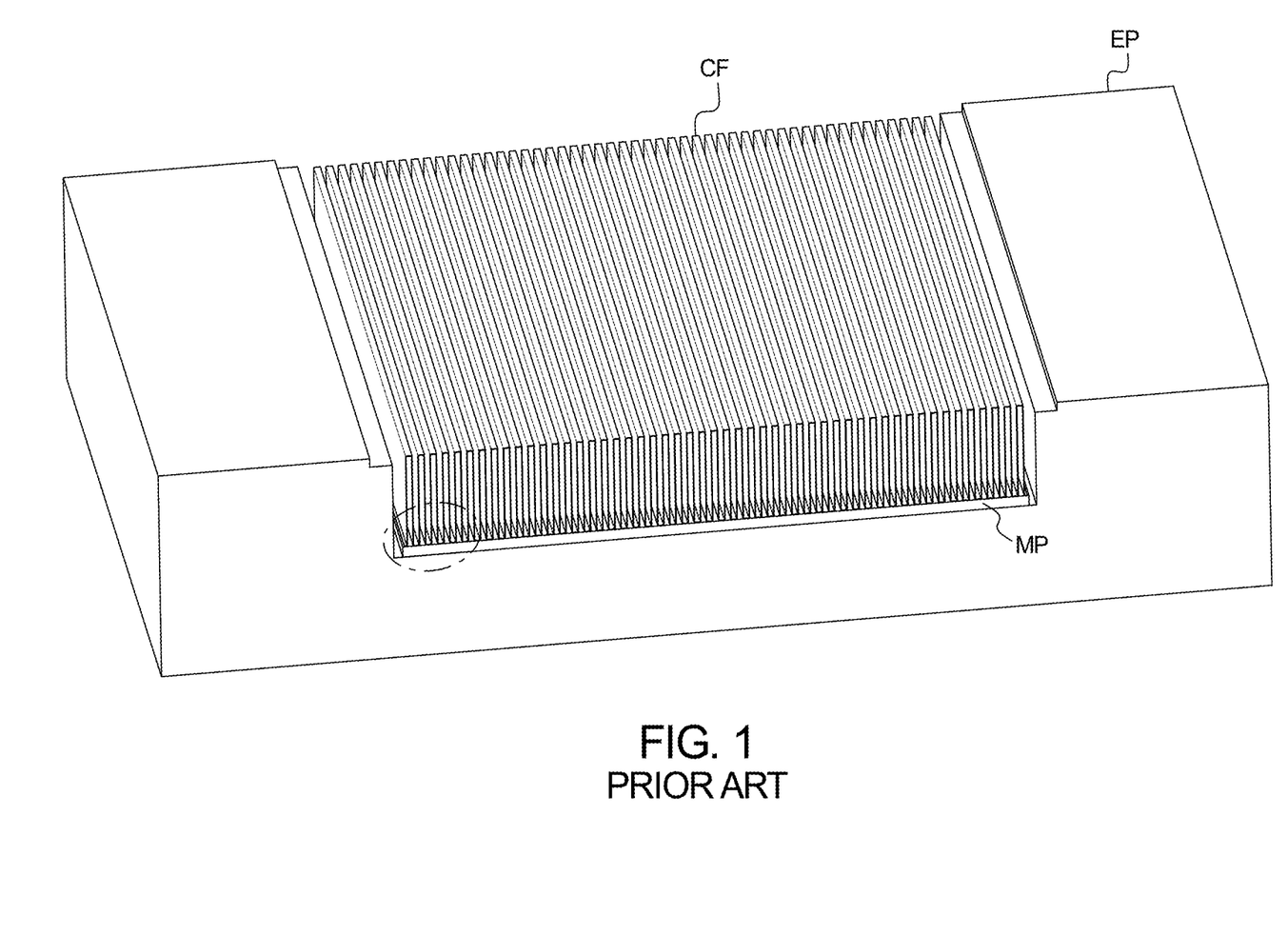
FIG. 1 is a top perspective view of a conventional cooling apparatus.
Figure 2:
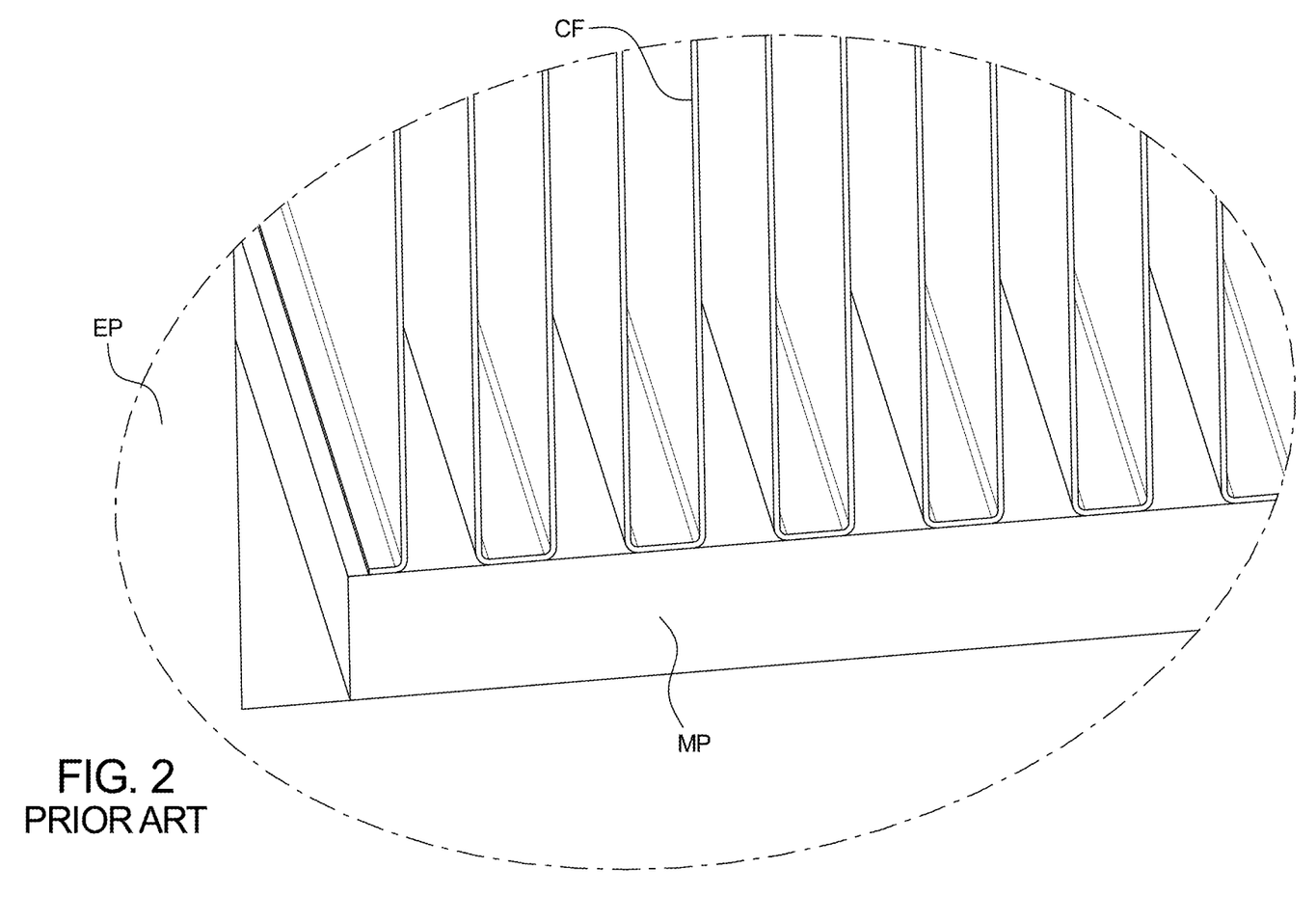
FIG. 2 is an enlarged view of a portion of the conventional cooling apparatus of FIG. 1.

Electronic products can be cooled to maintain a desired operating temperature to avoid failure. One conventional method of cooling electrical products are cooling fins. As shown in FIGS. 1 and 2, cooling fins CF can be added to the electronic product EP to increase the heat dissipating surface. Cooling fins can be made from machining, die-casting, or extrusion. These cooling fins need to be thick and heavy and have a limited surface area for heat dissipation due to their fabrication process compared to fins folded from thin sheet metal. As shown in FIGS. 1 and 2, conventional cooling fins CF are generally rectangular at both the end connected to the electrical product and the free end. This configuration requires the cooling fins to be welded or soldered to a metal plate MP. Such connections are generally non-continuous. That is, generally welding and soldering are performed at points along the cooling fins.

SUMMARY

Due to the limitation of the profile of conventional cooling fins, the existing folded fins are often welded or soldered to a plate first, which is then fastened to the system as the means of attaching the fins. This method of attachment is labor intensive. It has been discovered that changing the profile of the fins at the base as well as devising a new attachment method increases the thermal conductivity of the cooling apparatus or system.

In view of the state of the known technology, one aspect of the present disclosure is to provide a cooling apparatus for an electrical component housing including a fin configured to attach to the electrical component housing so as to conduct heat and cool the electrical component housing. The fin includes a first longitudinal portion and a second longitudinal portion, a first end, and a second end portion connecting the first and second longitudinal portions at a second end, the first longitudinal portion and the second longitudinal portion being disposed at a predetermined distance from each other at the first end, and the second end portion having a width that is greater than the predetermined distance.

Another aspect of the present disclosure is to provide a method of forming a cooling apparatus for an electrical component housing, the method comprising bending a single piece of metal to form a fin configured to attach to the electrical component housing so as to conduct heat and cool the electrical component housing, the fin including a first longitudinal portion and a second longitudinal portion, a first end, and a second end portion connecting the first and second longitudinal portions at a second end, the first longitudinal portion and the second longitudinal portion being disposed at a predetermined siatnce from each other at the first end, and second end portion having a width that is greater than the predetermined distancethe fin including a first longitudinal portion and a second longitudinal portion, a first end, and a second end portion connecting the first and second longitudinal portions at a second end, the first longitudinal portion and the second longitudinal portion being disposed at a predetermined siatnce from each other at the first end, and the second end portion having a width that is greater than the predetermined distance.

BRIEF DESCRIPTION OF THE DRAWINGS

Referring now to the attached drawings which form a part of this original disclosure.

DETAILED DESCRIPTION OF THE EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

Figure 3:
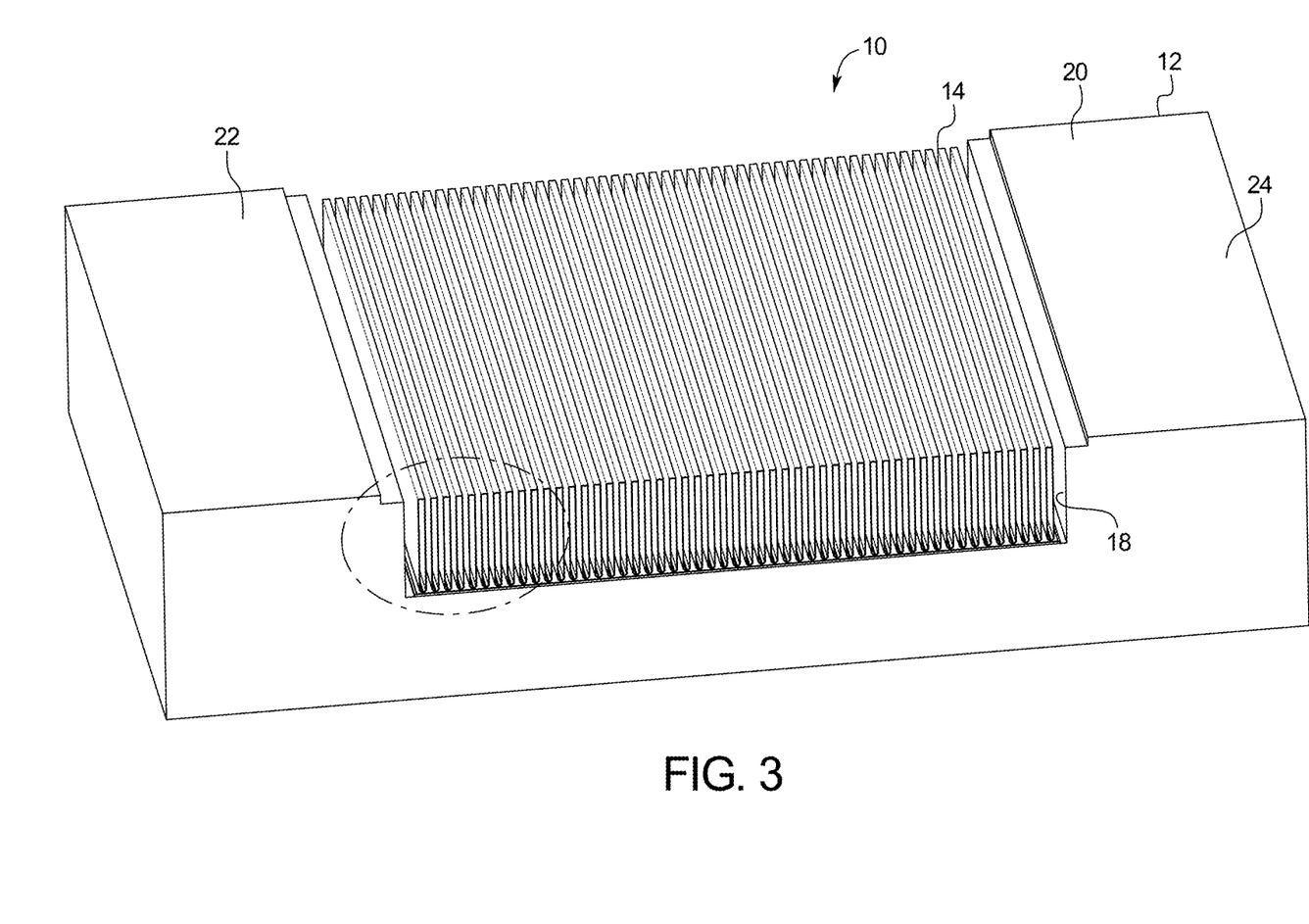
FIG. 3 is a top perspective view of a cooling apparatus according to a first embodiment of the present invention.
Figure 4:
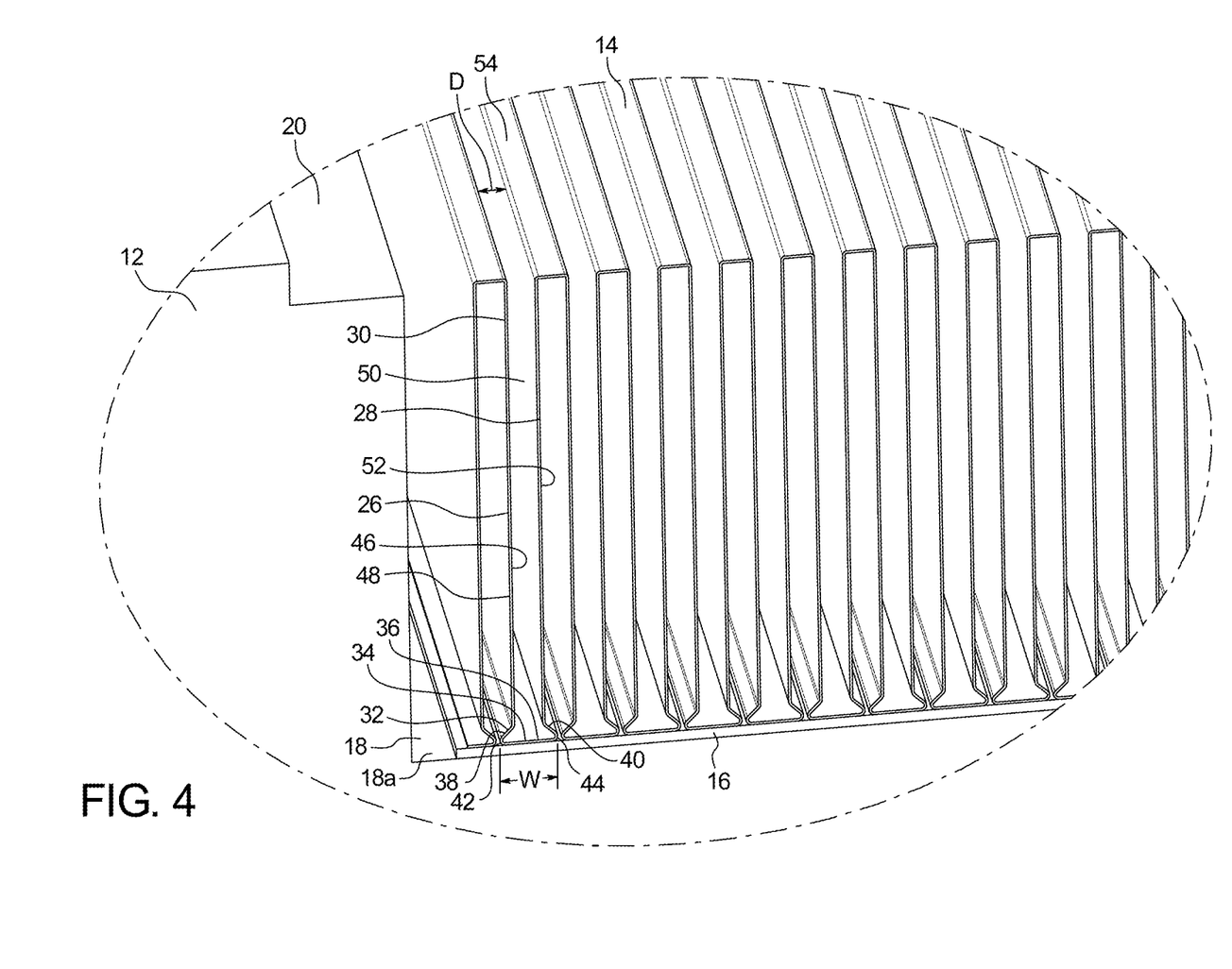
FIG. 4 is an enlarged view of the fins of the cooling apparatus of FIG. 3.

Referring initially to FIGS. 3 and 4, a cooling apparatus 10 is illustrated in accordance with a first embodiment. The cooling apparatus 10 is generally for an electrical component housing 12 and includes a plurality of fins 14 configured to attach to the electrical component housing 12 so as to conduct heat and cool the electrical component housing 12. The cooling apparatus 10 can include pressure sensitive adhesive (PSA) thermal interface material 16 between the plurality of fins and the cooling apparatus 10.

The electrical component housing 12 can be any electrical component housing that has electrical components disposed therein. In one embodiment the electrical component housing 12 is a metal, generally rectangular box that defines an interior space to house electrical components.

Figure 5:
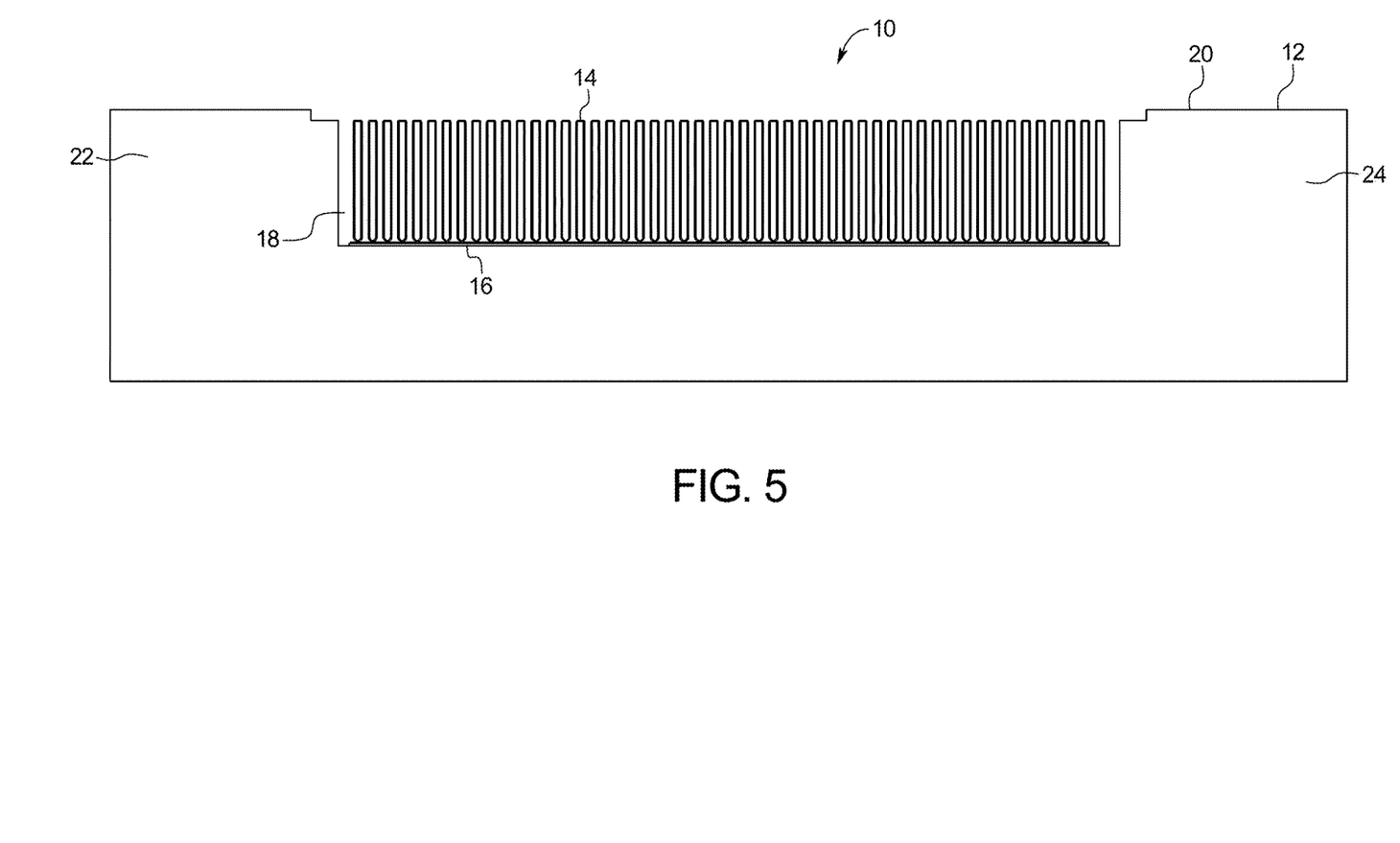
FIG. 5 is an elevational side view of the cooling apparatus of FIG. 3.

In this embodiment, the electrical components housed in the housing 12 can be satellite communication equipment, internet communication equipment or any other electrical equipment that would require or use thereof would be improved with a cooling apparatus 10. For example, the electrical component housing 12 can be a radio conversion unit (RCU) mounted on a based station of an internet satellite. The box can be a closed box with access through a panel or in any other suitable manner. In this embodiment, the housing 12 includes a recessed area 18 in the top surface 20 in which the cooling apparatus 10 can be disposed. However, it is noted that the cooling apparatus 10 can be disposed in any position and manner desired or suitable. As shown in FIGS. 3 and 5, the recessed portion 18 of the housing 12 forms a U-shaped recess with protrusions 22 and 24 on either side thereof.

The PSA thermal material 16 can be any suitable thermal material that is capable of transmitting or conducting heat from the electrical component housing 12 to the plurality of fins 14.

As shown in FIG. 4, each fin in the plurality of fins includes a first longitudinal portion 26 and a second longitudinal portion 28, a first end 30, and a second end portion 32. The first end 30 is open ended and defines a predetermined distance D between the first and second longitudinal portions. The second end portion 32 connects the first and second longitudinal portions 26 and 28 at a second end 34. The second end portion has a width W that is greater than the predetermined distance D at second end 34.

In one embodiment, the second end portion 32 has a substantially trapezoidal shape, such that the width W of the second end portion is approximately two times the predetermined distance D. In one embodiment, the width of the second end portion 32 is about 4.2 mm, which is more than twice the width of a conventional base (approximately 2 mm wide). This configuration increases the contact surface between the fin 14 and the surface to which is attaches, and therefore increases the thermal conductivity to the cooling apparatus 10.

As shown in FIG. 4, for each fin 14, the trapezoidal shape of the second end portion 32 (i.e., the attaching surface) that is attached to the PSA thermal material 16 by a base member 36, and includes a first inwardly extending member 38 (first leg portion) and a second inwardly extending member 40 (second leg portion). The first and second inwardly extending members 38 and 40 extend upwardly from the first end second ends 42 and 44 of the base member 36 and to the first and second longitudinal portions 26 and 28, respectively. The base member 36 thus extends between ends of the first and second inwardly extending members 38 and 40.

In other words, the first inwardly extending member 38 is connected to and extends outwardly from the first longitudinal portion 26 and the second inwardly extending member 40 is connected to and extends outwardly from the second longitudinal portion 28.

The first longitudinal portion 26 has an inner surface 46 an outer surface 48, and the second longitudinal portion 28 has an inner surface 50 and an outer surface 52. The inner surface 46 of the first longitudinal portion 26 faces the inner surface 50 of the second longitudinal portion 28 so as to define a gap therebetween. The majority of the gap has the same or substantially the same distance as the predetermined distance D.

As shown in FIG. 4, the fin 14 is one of a plurality of fins 14, each fin of the plurality of fins 14 having substantially the same shape. The fins are configured and arranged such that the base members 36 are positioned on the PSA thermal material 16 adjacent each other and the outer surface 48 of the first longitudinal portion 26 faces the outer surface 52 of the adjacent second longitudinal portion 28. The first longitudinal portion 26 of each fin 14 is connected to the second longitudinal portion 28 of each adjacent fin with a connecting member 54.

To form the plurality of fins 14, a single piece of metal is shaped to form each of the fins 14, so as to be unitarily connect each fin 14 together. More specifically, to form the plurality of fins 14 each fin 14 is bent into the shape illustrated. That is, as shown in FIG. 4, one half of the fin 14 can be formed first. In this embodiment, a part of the base member 36 is formed and then the second inwardly extending member 40 is formed. The second longitudinal portion 28 extends upwardly and the single piece of metal is bent to form a connecting member 54 that connects adjacent fins 14.

The connecting member 54 with the first and second longitudinal portions 26 and 28 form a rectangular end. That is, the connecting member 54 extends generally parallel to the surface 18a of the recess portion 18 and perpendicular to the first and second longitudinal portions 26 and 28. In one embodiment, the first longitudinal portion 26 has a width between the first and second longitudinal portions 26 and 28 that is generally about the same distance as the predetermined distance D; however, it is noted that the connecting portion can have any desired or suitable width. The first longitudinal portion 26 extends downwardly and the first inwardly extending member 38 is formed at the end of the first longitudinal portion 26. The base member 36 is them formed and then the second inwardly extending member 40. This procedure is repeated to form the desired number of fins 14.

As shown in FIGS. 4 and 5, this embodiment enables a significant increase in the size of the base member 36 improving the surface area of the fins 14 that contacts the PSA thermal material 16. Due to this increased contact area of the trapezoidal structure, this embodiment enables the use of PSA, which otherwise is not feasible with a conventional shaped fin.

The plurality of fins 14 can then be attached to the PSA thermal material 16 which is then attached in the recess 18 of the electrical component housing 12. As shown in FIGS. 4 and 5, this embodiment enables a significant increase in the size of the base member 38 improving the surface area of the fins 14 that contacts the PSA thermal material 16. As described herein, the base member 36 of this embodiment is more than twice the width of a conventional base. This configuration increases the contact surface between the base member 36 and the PSA material 16. Moreover, each base member 36 can be positioned in relative close proximity to an adjacent base member 36, which significantly increases the overall surface area of the plurality of fins 14 in contact with the PSA thermal material 16. Moreover, this structure results in a continuous connection between the PSA thermal material 16 and the cooling fins 14 and the PSA thermal material 16 and the electrical component housing 12. This structure is a significant improvement of the conventional cooling fin structure.

A cooling apparatus 10 having this profile of fins 14 has been found to increase and improve the thermal conductivity of the cooling apparatus 10.

Figure 6:
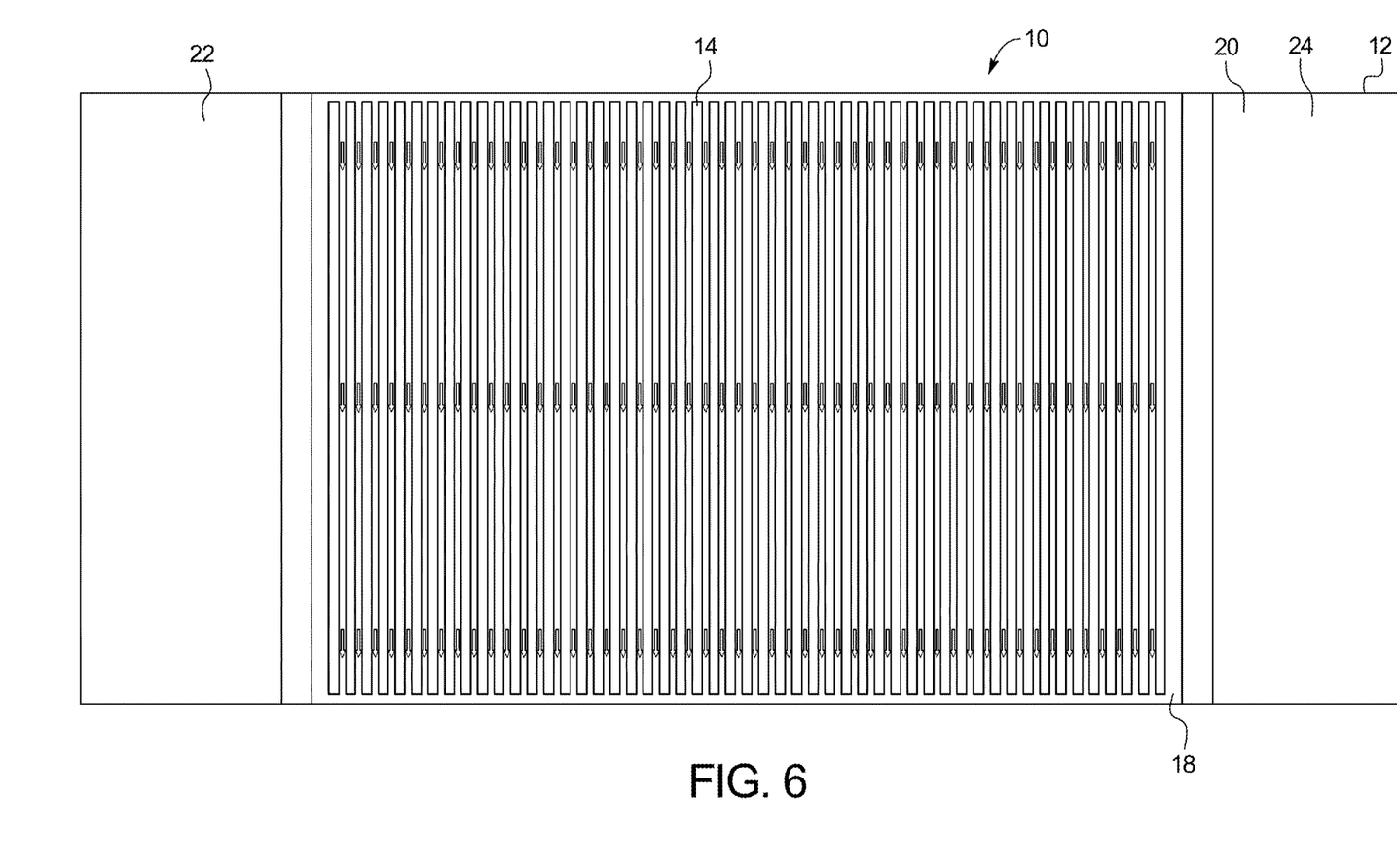
FIG. 6 is a top view of the cooling apparatus of FIG. 3.

As shown in FIG. 6, air (as illustrated by the arrows) is able to pass through and between the cooling fins 14, which cools the cooling fins 14, dissipating heat from the electrical component housing 12. In one embodiment, the air passing through and between the cooling fins 14 is moved using a fan (not shown) or other suitable method. However, it is noted that a fan is not necessary, and the air can simply pass through and between the cooling fins 14 naturally.

Figure 7:
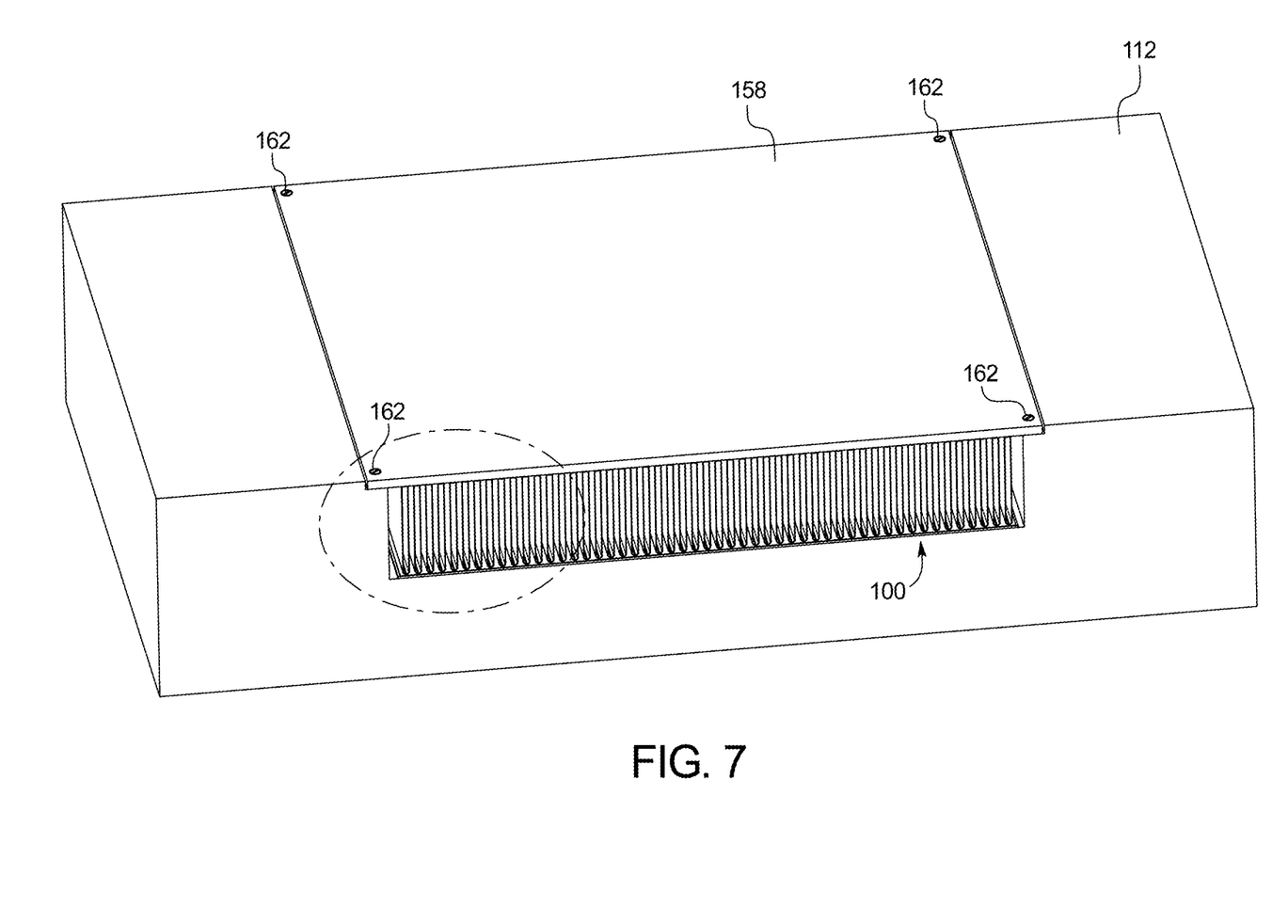
FIG. 7 is a top perspective view of a cooling apparatus according to a second embodiment of the present invention.
Figure 8:
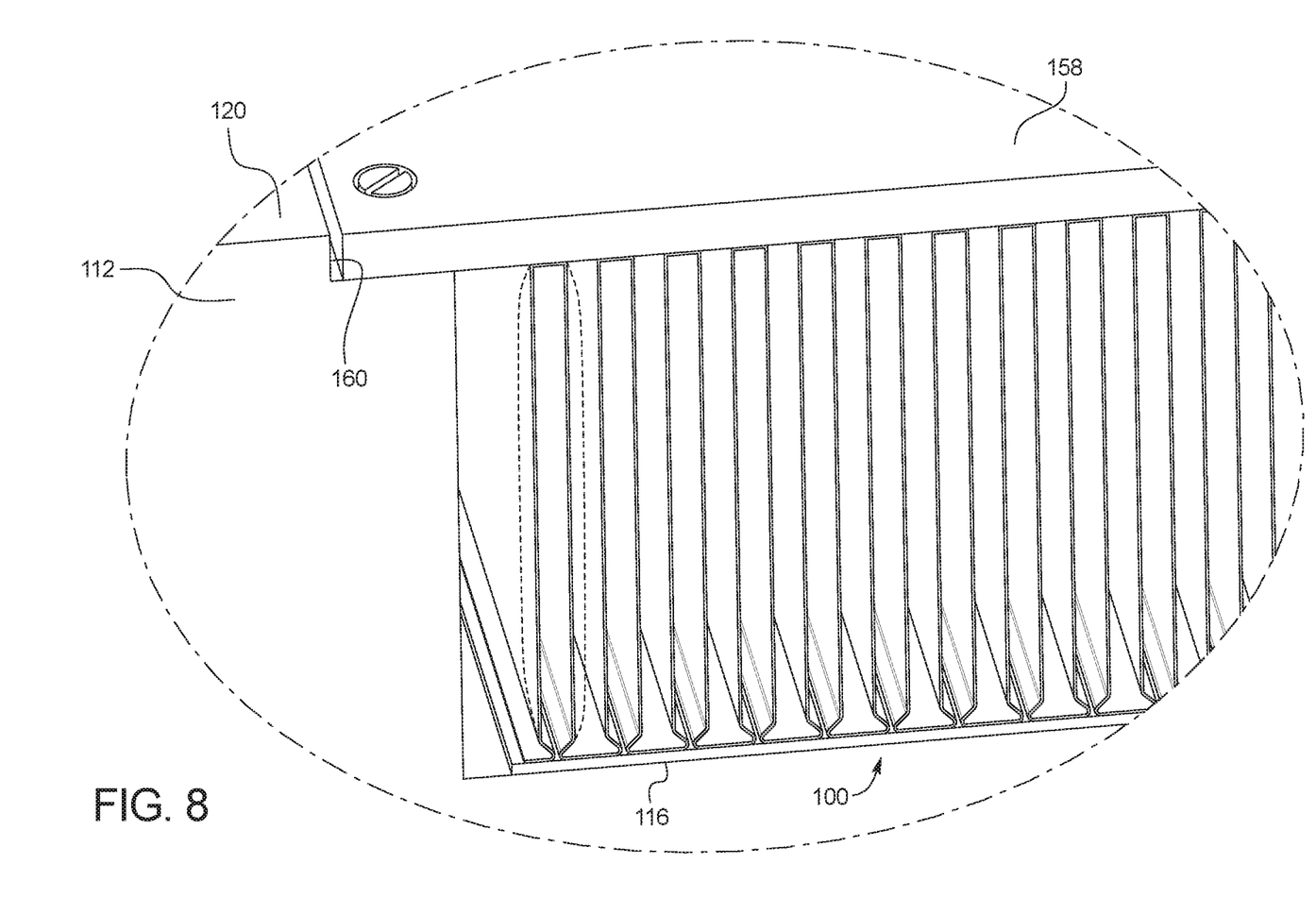
FIG. 8 is an enlarged view of the fins of the cooling apparatus of FIG. 7.
Figure 9:
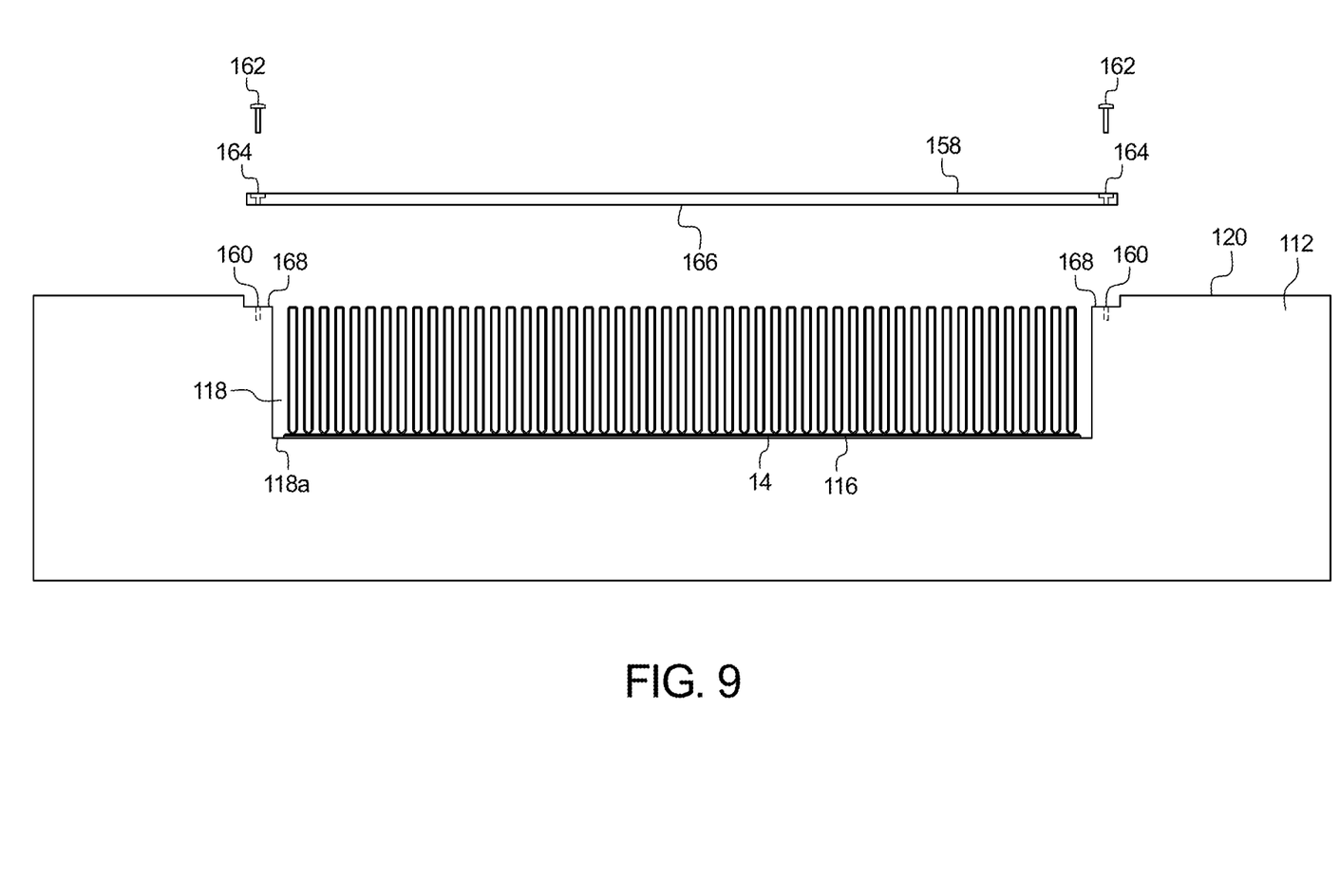
FIG. 9 is an elevational side view of the cooling apparatus of FIG. 7 with the clamping plate removed.

FIGS. 7-9 illustrate a second embodiment of the present invention. In this embodiment, the cooling apparatus 100 includes cooling fins 14 and a thermal pad 116, the cooling fins 14 have the same basic structure as described above, and thus any description thereof is applicable to this embodiment. However, in this embodiment of the cooling apparatus 100, the base members 36 of the cooling fins 14 are attached to the electrical component housing 112 with thermal pad 116. The thermal pad 116 is configured to transmit heat from the electrical component housing 112 to the cooling fins 14.

In this embodiment, a clamping plate 158 can be disposed on the connecting members 54 of the cooling fins 14 to hold the cooling fins 14 in position. As shown in FIGS. 7-9, the clamping plate 158 is disposed in a recess 160 in the top surface 120 of the electrical component housing 112 and coupled to the electrical component housing 112 using fasteners 162. As is understood, the fasteners 162 can be screws that pass through openings 164 in the clamping plate 158 and are threaded into the electrical component housing 112.

The clamping plate 158 can be connected to the electrical component housing 112 in any suitable manner and does not necessarily need to be screwed thereto. For example, the clamping plate 158 can be attached or adhered using any material or method and does not necessarily need to be attached in a recess.

The clamping plate 158 is configured to compress the cooling fins 14 between a surface 166 of the clamping plate 158 and a surface 168 of the recess 160 of the electrical component housing 112. This compression or clamping force holds the cooling fins 14 within the recess 118 in the electrical component housing 112. In this embodiment, the trapezoidal shape of the second end 32 of the cooling fins 14 improves the capability of the clamping plate 158 to hold the cooling fins 14 in position. That is, as shown in FIG. 7, by the dashed line, the trapezoidal shape causes a springing action (i.e., acts as a leaf spring) based on the compression between the surface 166 of the clamping plate and the surface 118a of the recess 118 of the electrical component housing 112. The springing action absorbs the force applied by the compression from the clamping plate 158 and the electrical component housing 112 and applies a force in the opposite directions. This force increases the frictional forces between the cooling fins 12 and the surface of the clamping plate 166 and the surface 118a of the recess 118 of the electrical component housing 112, improving the positioning hold of the clamping plate.

It has been determined that the present invention increases the thermal conductivity of a cooling apparatus or system.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "portion," or "member" when used in the singular can have the dual meaning of a single part or a plurality of parts. Also as used herein to describe the above embodiment(s), the following directional terms "forward", "upward" and "downward", as well as any other similar directional terms refer to those directions of the herein described cooling apparatus for an electrical component. Accordingly, these terms, as utilized to describe the present invention should be interpreted relative to a cooling apparatus for an electrical component.

The term "configured" as used herein to describe a component, section or part of a device includes hardware and/or software that is constructed and/or programmed to carry out the desired function.

The terms of degree such as "substantially", "about" and "approximately" as used herein mean a reasonable amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such features. Thus, the foregoing descriptions of the embodiments according to the present invention are provided for illustration only, and not for the purpose of limiting the invention as defined by the appended claims and their equivalents.

What is claimed is:

1. A cooling apparatus for an electrical component housing, the cooling apparatus comprising:
   a fin configured to attach to the electrical component housing so as to conduct heat and cool the electrical component housing, the fin including a first longitudinal portion and a second longitudinal portion, a first end, and a second end portion connecting the first and second longitudinal portions at a second end, the first longitudinal portion and the second longitudinal portion being disposed at a predetermined distance from each other at the first end, the second end portion having a width that is greater than the predetermined distance; and
   a removable clamping plate disposed at the first end of the fin such that the first end of the fin abuts a surface of the clamping plate, the clamping plate being a unitary structure and configured to compress the fin between the surface of the clamping plate and a surface of a recess of the electrical component housing to hold the fin within the recess in the electrical component housing, a fixing force applied by the compression from the clamping plate providing frictional forces between the fin and the surface of the clamping plate and the fin and the surface of the recess of the electrical component housing so as to positionally hold the clamping plate.

2. The cooling apparatus of claim 1, wherein the second end portion has a substantially trapezoidal shape.

3. The cooling apparatus of claim 2, wherein
   the clamping plate is configured to compress the fin between the surface of the clamping plate and the surface of the recess of the electrical component housing to cause a springing action caused by the fin which absorbs the force applied by the compression from the clamping plate and applies a force in the opposite directions.

4. The cooling apparatus of claim 1, wherein
   the width of the second end portion is approximately two times the predetermined distance.

5. The cooling apparatus of claim 1, wherein
   the first longitudinal portion has an inner surface and an outer surface, and the second longitudinal portion has an inner surface and an outer surface, the inner surface of the first longitudinal portion facing the inner surface of the second longitudinal portion so as to define a gap therebetween.

6. The cooling apparatus of claim 1, wherein
the second end portion has a first leg portion, a second leg portion and an attaching surface extending between the first and second leg portions.

7. The cooling apparatus of claim 6, wherein
the first leg portion is connected to and extends outwardly from the first longitudinal portion and the second leg portion is connected to and extends outwardly from the second longitudinal portion.

8. The cooling apparatus of claim 6, wherein
the attaching surface is configured to attach to at least one of pressure sensitive adhesive (PSA) material and a thermal pad.

9. The cooling apparatus of claim 1, wherein
the fin is one of a plurality of fins, each fin of the plurality of fins having substantially the same shape, and being connected to an adjacent fin by a first end portion.

10. The cooling apparatus of claim 9, wherein
the plurality of fins are formed from a single piece of metal so as to be unitarily connected together.

11. A method of forming a cooling apparatus for an electrical component housing, the method comprising:
bending a single piece of metal to form a fin configured to attach to the electrical component housing so as to conduct heat and cool the electrical component housing, the fin including a first longitudinal portion and a second longitudinal portion, a first end, and a second end portion connecting the first and second longitudinal portions at a second end, the first longitudinal portion and the second longitudinal portion being disposed at a predetermined distance from each other at the first end, the second end portion having a width that is greater than the predetermined distance;
positioning the fin in a recess of the electrical component housing; and
positioning a removable clamping plate such that the first end of the fin abuts a surface of the clamping plate, the clamping plate being a unitary structure and applying a fixing force with the clamping plate to compress the fin between the surface of the clamping plate and a surface of a recess of the electrical component housing to hold the fin within the recess in the electrical component housing, the fixing force providing frictional forces between the fin and the surface of the clamping plate and the fin and the surface of the recess of the electrical component housing so as to positionally hold the clamping plate.

12. The method of claim 11, wherein the second end portion has a substantially trapezoidal shape.

13. The method of claim 11, wherein
the width of the second end portion is approximately two times the predetermined distance.

14. The method of claim 11, wherein
the first longitudinal portion has an inner surface and an outer surface, and the second longitudinal portion has an inner surface and an outer surface, the inner surface of the first longitudinal portion facing the inner surface of the second longitudinal portion so as to define a gap therebetween.

15. The method of claim 11, wherein
the second end portion has a first leg portion, a second leg portion and an attaching surface extending between the first and second leg portions.

16. The method of claim 15, wherein
the first leg portion is connected to and extends outwardly from the first longitudinal portion and the second leg portion is connected to and extends outwardly from the second longitudinal portion.

17. The method of claim 15, wherein
the attaching surface is configured to attach to at least one of pressure sensitive adhesive (PSA) material and a thermal pad.

18. The method of claim 11, wherein
the fin is one of a plurality of fins, each fin of the plurality of fins having substantially the same shape, and being connected to an adjacent fin by a first end portion.

19. The method of claim 18, wherein
the plurality of fins are formed from a single piece of metal so as to be unitarily connected together.

\* \* \* \* \*